United States Patent
Srinivasan et al.

(10) Patent No.: US 12,512,322 B2
(45) Date of Patent: Dec. 30, 2025

(54) SMALL GRAIN SIZE POLYSILICON ENGINEERING FOR THRESHOLD VOLTAGE MISMATCH IMPROVEMENT

(71) Applicant: TEXAS INSTRUMENTS INCORPORATED, Dallas, TX (US)

(72) Inventors: Bhaskar Srinivasan, Allen, TX (US); Pushpa Mahalingam, Richardson, TX (US); Mahalingam Nandakumar, Richardson, TX (US); Mona Eissa, Allen, TX (US); Corinne Gagnet, Dallas, TX (US); Christopher Whitesell, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 17/589,329

(22) Filed: Jan. 31, 2022

(65) Prior Publication Data
US 2023/0245891 A1     Aug. 3, 2023

(51) Int. Cl.
*H10D 64/66* (2025.01)
*H01L 21/28* (2006.01)
*H10D 84/01* (2025.01)
*H10D 84/03* (2025.01)
*H10D 84/83* (2025.01)

(52) U.S. Cl.
CPC ..... *H01L 21/28052* (2013.01); *H10D 64/663* (2025.01); *H10D 84/0137* (2025.01); *H10D 84/038* (2025.01); *H10D 84/83* (2025.01)

(58) Field of Classification Search
CPC .............. H01L 21/28; H01L 21/8234; H01L 21/28052; H01L 21/823443; H01L 27/088; H01L 29/49; H01L 29/4933

USPC .......................................................... 438/585
See application file for complete search history.

(56) References Cited

U.S. PATENT DOCUMENTS

| | | | |
|---|---|---|---|
| 5,189,504 A * | 2/1993 | Nakayama | H01L 21/2807 257/422 |
| 5,396,084 A * | 3/1995 | Matsumoto | H01L 27/1214 438/30 |
| 5,998,842 A * | 12/1999 | Sano | H01L 27/0928 257/E29.264 |
| 2004/0009651 A1* | 1/2004 | Han | H01L 29/42324 438/257 |
| 2005/0173739 A1* | 8/2005 | Kusumoto | H01L 29/812 257/280 |
| 2006/0148151 A1* | 7/2006 | Murthy | H01L 21/02532 257/E29.267 |
| 2009/0065816 A1* | 3/2009 | Cunningham | H01L 21/32155 257/E29.004 |
| 2011/0162706 A1* | 7/2011 | Borden | H01L 31/03682 257/E31.119 |
| 2013/0023098 A1* | 1/2013 | Huang | H01L 29/66606 438/287 |

* cited by examiner

*Primary Examiner* — Ajay Ojha
(74) *Attorney, Agent, or Firm* — Andrew R. Ralston; Frank D. Cimino

(57) ABSTRACT

A system and method for growing fine grain polysilicon. In one example, the method of forming an integrated circuit includes forming a dielectric layer over a semiconductor substrate, and forming a polysilicon layer over the dielectric layer. The polysilicon layer is formed by a chemical vapor deposition process that includes providing a gas flow including disilane and hydrogen gas over the semiconductor substrate.

26 Claims, 6 Drawing Sheets

SMALL GRAIN SIZE POLYSILICON ENGINEERING FOR THRESHOLD VOLTAGE MISMATCH IMPROVEMENT

TECHNICAL FIELD

The present disclosure relates to the field of semiconductor devices and, more particularly, but not exclusively, to a metal-oxide semiconductor field-effect transistor having a polysilicon layer with improved grain size distribution.

BACKGROUND

With the continuing trend in the semiconductor industry towards scaling down the size of metal-oxide semiconductor field-effect transistors (MOSFETs), it becomes increasingly important to find ways to maintain matching between MOSFET pairs. Typically devices for integrated circuits with a need for matching are fabricated side-by-side at the same location on a semiconductor die to reduce the possibilities of intra-die parameter variations if placed at a distance apart. However, even with such care individual MOSFETs still exhibit a degree of random parameter variations, resulting in observed mismatch between a plurality of nominally identical devices on a semiconductor die. This is due to the stochastic nature of the physical processes a device undergoes during its fabrication. As a result, mismatches in the threshold voltage between proximate devices are typically present. This mismatch can result in a loss of circuit accuracy in key performance metrics such as gain.

One source of threshold voltage mismatch may be stochastic variations in gate electrode dopant diffusion leading to dopant clustering and incomplete activation of dopants. Such diffusion may result when the grain size of the gate electrode polycrystalline silicon (also referred to as "polysilicon") is sufficiently large since channeling paths along grain boundaries may align in a manner that allow some dopants to reach the channel region at the gate dielectric-to-bulk interface while causing local depletion of polysilicon at other locations along the polysilicon-to-gate dielectric interface. These localized effects may in turn cause local changes to the threshold voltage needed to enhance the channel. As a result, even identically configured proximate devices may have differing levels and locations of these stochastic effects.

Accordingly, what is needed is a methodology to address the grain size of polysilicon layers of a MOSFET and the resulting threshold voltage mismatches between MOSFETs in an integrated circuit.

SUMMARY

This Summary is provided to introduce a brief selection of disclosed concepts in a simplified form that are further described below in the Detailed Description including the drawings provided. Various disclosed methods and systems of the present disclosure may be beneficially applied to MOS transistors, including matched transistors, to improve grain size distribution and stability. While such examples may be expected to provide improvements in performance, such as improved matching of threshold voltage among matched transistors, no particular result is a requirement of the present invention unless explicitly recited in a particular claim.

In one example, the method of forming an integrated circuit includes forming a dielectric layer over a semiconductor substrate, and forming a polysilicon layer over the dielectric layer. The polysilicon layer is formed by a chemical vapor deposition process that includes providing a gas flow including disilane and hydrogen gas over the semiconductor substrate.

Another provides an integrated circuit having a MOS transistor. The MOS transistors includes a gate dielectric over a semiconductor substrate, a gate electrode over the gate dielectric, a pre-metal dielectric over the gate electrode, and a metal contact to the gate electrode through the pre-metal dielectric. The gate electrode includes a polysilicon layer having a mean grain size of 50 nanometers (nm) or less.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated that the specific examples disclosed may be readily utilized as a basis for modifying or designing other structures or processes for carrying out the same purposes of the present disclosure. It should also be realized that such equivalent constructions do not depart from the spirit and scope of the disclosure as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated, and may not be described again in the interest of brevity after the first instance. The FIGUREs are drawn to illustrate the relevant aspects of exemplary embodiments.

DETAILED DESCRIPTION

Figure 1:
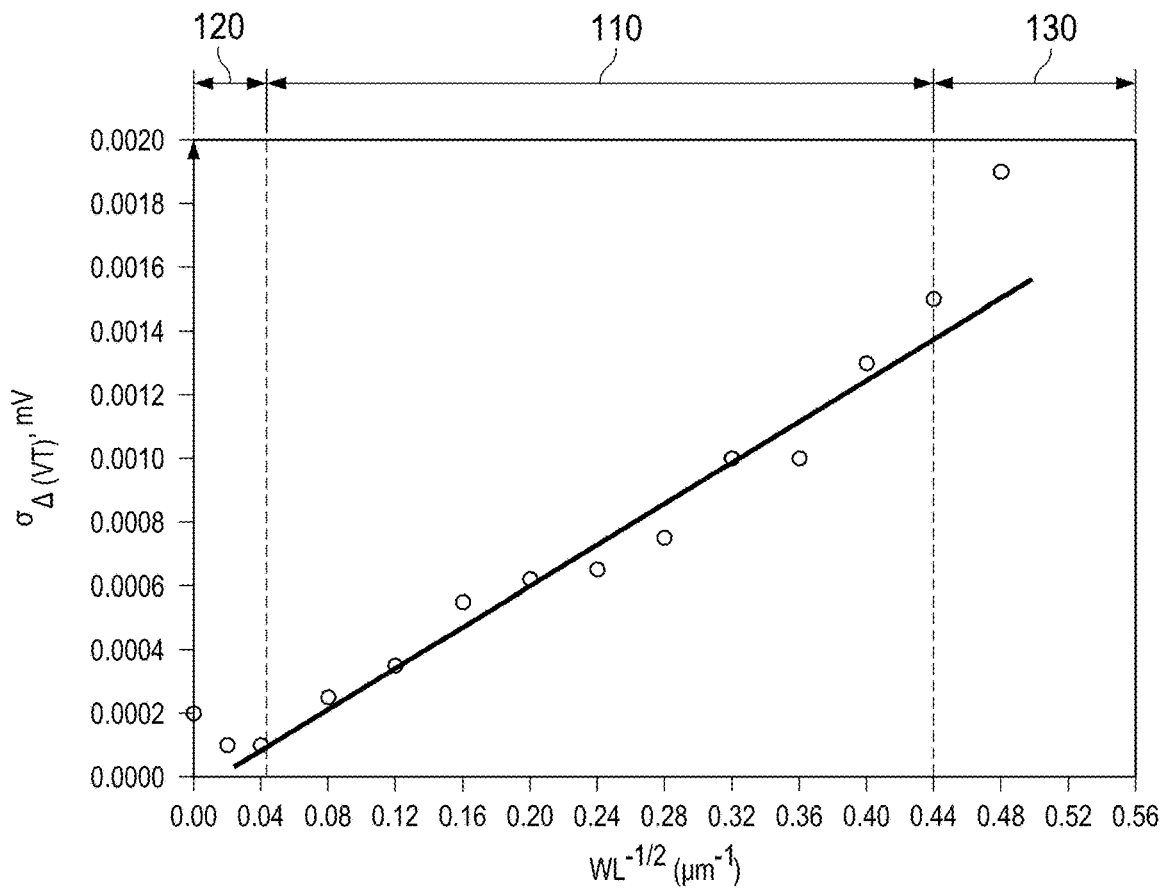
FIG. 1 illustrates a graphical representation of standard deviation versus gate area for threshold voltage mismatch for metal-oxide semiconductor field-effect transistors (MOSFETs) in an integrated circuit.

The making and using of the examples are discussed in detail below. It should be appreciated, however, that the present disclosure provides many applicable concepts that can be embodied in various specific contexts. The specific examples discussed are merely illustrative of specific ways to make and use examples consistent with the disclosure, and do not impliedly limit the scope of the disclosure. The specific embodiments discussed herein are merely illustrative of specific ways to make and use manufacturing processes and methods for producing a semiconductor device having a fine grain polysilicon layer. While the principles will be described in the environment of a metal-oxide semiconductor field-effect transistor (MOSFET) with controllable conductivity, any semiconductor device that can benefit from with a fine grain polysilicon layer is well within the broad scope of the present disclosure.

For additional understanding of forming polysilicon structures on a silicon substrate, see, e.g., US20210134939A1 (U.S. patent application Ser. No. 17/085,116), which is incorporated herein by reference in its entirety.

In some cases a MOSFET utilizes a polysilicon layer for its gate electrode material which is deposited directly above a gate dielectric layer and a drain-source channel region. A gate voltage applied to the gate electrode controls channel conductivity. A threshold voltage (also referred to as "VT") is the voltage at which the channel region starts to conduct. The accumulation over time of dopant along the interface between the channel and the gate dielectric layer may alter the value of the threshold voltage resulting in lower or higher values than a nominal VT. Since randomness effects the dopant distribution, the VT typically has a random variation, particularly when comparing the threshold voltage values of otherwise identically laid-out MOSFETs that are closely spaced from one another. This mismatch imposes limitations on circuit performance such as differential amplifier gain that relies on identically biased input stage transistors with similar or identical threshold voltage values.

Threshold voltage mismatch (ΔVT) of identical MOSFETs is modeled by a widely accepted and experimentally proven model in the form of a normal distribution with a variance σ (ΔVT) dependent on the device area (gate width, W in micrometers (μm) multiplied by gate length, L in μm or WL) expressed in millivolts as:

$$\sigma(\Delta VT) = A_{VT}/\sqrt{(WL)} = A_{VT} \cdot WL^{-1/2},$$

where $A_{VT}$ has units of millivolts micrometers (mV·μm) and is a process-dependent threshold voltage mismatch constant that can be empirically extracted for any given process technology and node. It is obtained by measuring the threshold voltage of many test-device pairs, each pair adjacent to its nominally identical partner, over several differing width and length values for a given technology node. The slope of the resulting linear best-fit of standard deviation of threshold voltages, σ (ΔVT), in millivolts as a function of the reciprocal of the square root of the gate area (1/sqrt (WL) in μm$^{-1}$) is the threshold voltage mismatch constant $A_{VT}$ in units of millivolts micrometers (mV·μm).

FIG. 1 provides a graph 100 of standard deviation of delta VT (σ($A_{VT}$)) between two nominally matched transistors versus the inverse root of gate area (gate length times gate width), $WL^{-1/2}$, for metal-oxide semiconductor field-effect transistors (MOSFETs) in an integrated circuit. Points on the graph correspond to discrete values of gate area that may be formed on the integrated circuit for the purpose of characterizing σ($A_{VT}$). Such characterization is representative of production integrated circuits that use matched transistors in the characterized range of transistor areas. Larger values of $WL^{-1/2}$ correspond to smaller transistor areas, and smaller values of $WL^{-1/2}$ correspond to larger transistor areas.

The graph 100 includes a linear region 110, a lower tail region 120 and an upper tail region 130. The linear region 110 includes those data points that lie close to a linear best-fit, or regression, to the data points. The lower tail region 120 includes data points that deviate from the linear model line may be disregarded as being due to distance (gradient) effects, while the upper tail region 130 includes data points that deviate from the linear model line and may be disregarded as being due to parasitic or small size effect. In the current example the linear range is between about 0.04 μm$^{-1}$ and about 0.44 μm$^{-1}$. The slope of the linear fit is $A_{VT}$, where a smaller value of $A_{VT}$ indicates better matching between matched transistor pair.

One way to reduce the effects of threshold voltage mismatch would be to grow the polysilicon grains of the MOSFETs to be smaller in size so that the grain density rises thereby reducing the size and length of grain boundaries which will in turn reduce the available channeling paths for dopants to travel through. Baseline polysilicon growth methods are able to deposit the requisite small grain size but after the layer is exposed to the entire thermal budget of all the fabrication steps for a MOSFET, the grains significantly grow to much larger sizes thereby defeating the original small grain size that was obtained at the initial stage.

Traditional growth methods of polysilicon rely on deposition of silicon from silicon tetrahydride gas (also referred to as silane or SiH$_4$), simply referred to as silane (silane furnace method). The polysilicon may be produced in a furnace at a temperature such as between 500° C. and 800° C. by decomposing silane in a low-pressure chemical vapor deposition process. Polysilicon deposited by this method results in a granular structure of the film that is composed of grains in which the structure is uniformly monocrystalline within each grain. At grain boundaries, where a grain meets an adjacent grain, an abrupt change in the crystal orientation occurs. Therefore, the entire film structure becomes polycrystalline with boundaries between every grain and its neighbors. The grain size is dependent in part on the total thermal exposure it receives during processing. Typical grain sizes as deposited in the furnace can be approximately 30 nm in diameter. However, as a wafer progresses through the entire set of processing steps necessary to fabricate a complete MOSFET, the polysilicon is subjected to additional thermal cycles which, in turn, lead to continued growth of each grain. At the end-of-line, a grain may have tripled in size to approximately 100 nm.

This increase in size decreases the grain boundary density which makes channeling paths much more likely. The grain boundaries create channels through which dopants may diffuse from one side of the film to the other. This can occur during subsequent dopant implants for the source or drain or lateral drain diffusion steps of a MOSFET or power MOSFET with drain diffusion regions. These dopants can reach the under-side of the polysilicon gate through the gate dielectric layer to the top of the channel region directly under the gate. The accumulation over time of dopants at the gate dielectric-to-channel interface may cause the threshold voltage in that region to shift, thereby introducing a stochastic variation in its aggregate measured nominal value at the gate electrode.

The problem of large polysilicon grain size leads to a stochastic variation in the gate threshold voltage thereby introducing performance limitations of the integrated circuits relying on matched threshold voltage between transistor pairs. The method(s) as described herein reduce(s) these variations by reducing the grain size at the end-of line, so grain boundary channeling path densities increase thereby reducing the chance of dopants non-uniformly accumulating at the gate dielectric-to-channel interface.

Figure 2:
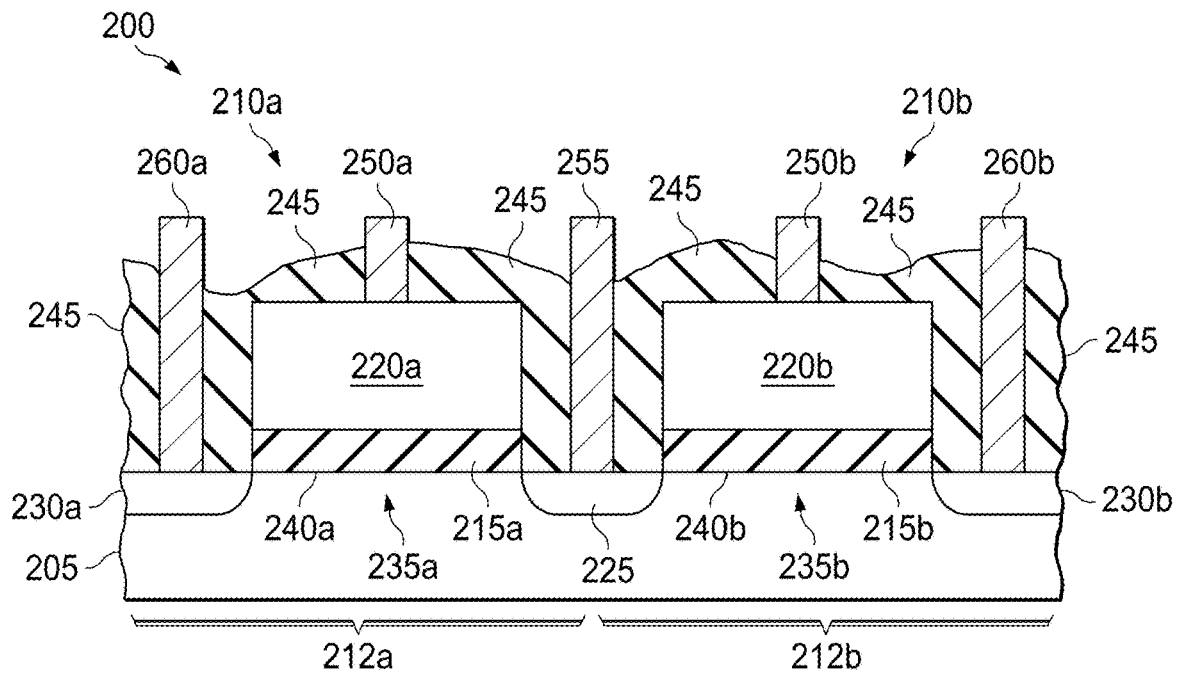
FIG. 2 illustrates a cross sectional view of an integrated circuit.

Turning now to FIG. 2, illustrated is a cross sectional view of an integrated circuit 200 including a first MOSFET 210*a* in a first region 212*a* and a second MOSFET 210*b* in a second region 212*b* on/over a substrate 205. In this example, the first region 212*a* is adjacent the second region 212*b*, and the first and second MOSFETs 210*a*, 210*b* are the same type of device, e.g. nominally identical. The first MOSFET 210*a* includes a gate dielectric layer (e.g., a gate oxide layer 215*a*) formed over the substrate 205 and a polysilicon layer (e.g., a polysilicon gate 220*a*) formed over the gate oxide layer 215*a*. The first MOSFET 210*a* also includes a source 225, a drain 230*a* and a channel 235*a* therebetween. The junction between the gate oxide layer 215*a* and the channel 235*a* is referred to as a channel interface 240*a*. A metal silicide layer (not shown) is formed over the polysilicon gate 220*a*, the source 225, and the drain 230*a*, and metal such as tungsten is formed within openings formed in a dielectric layer 245 to form a gate contact 250*a*, a source contact 255 and a drain contact 260*a*, respectively.

The second MOSFET 210*b* also includes a gate dielectric layer (e.g., a gate oxide layer 215*b*) formed over the substrate 205 and a polysilicon layer (e.g., a polysilicon gate 220*b*) formed over the gate oxide layer 215*b*. The second MOSFET 210*b* also includes the source 225, a drain 230*b* and a channel 235*b* therebetween. The junction between the gate oxide layer 215*b* and the channel 235*b* is referred to as a channel interface 240*b*. A metal silicide layer (not shown) is formed over the polysilicon gate 220*b*, the source 225, and the drain 230*b*, and patterned and separated by the dielectric layer 245 to form a gate contact 250*b*, the source contact 255 and a drain contact 260*b*, respectively. While the layout of the first and second MOSFETs 210*a*, 210*b* may be and identical, nevertheless threshold voltage variations may exist between the pair due to the crystalline structure of the respective polysilicon gates 220*a*, 220*b*.

Figure 3:
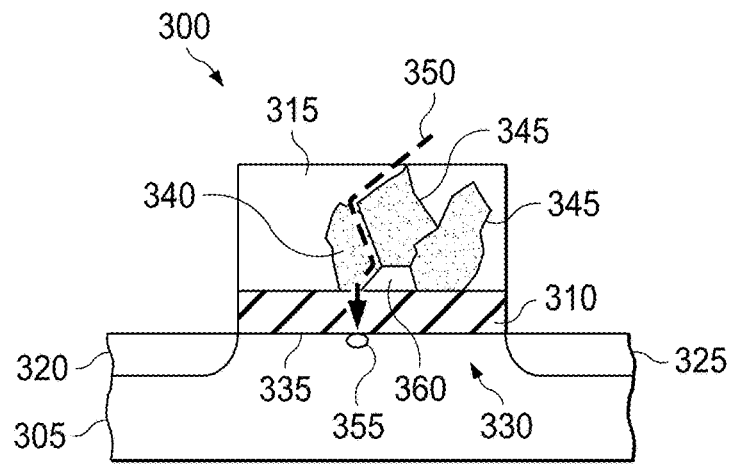
FIG. 3 illustrates a cross sectional view of a portion of a baseline MOSFET.

Turning now to FIG. 3, illustrated is a cross sectional view of a portion of a baseline MOSFET 300. The MOSFET 300 includes a gate dielectric layer (e.g., a gate oxide layer 310) formed over a substrate 305 and a polysilicon layer (e.g., a polysilicon gate 315) formed over the gate oxide layer 310 using a baseline silane furnace method. The MOSFET 300 also includes a source 320, a drain 325 and a channel 330 therebetween. The junction between the gate oxide layer 310 and the channel 330 is referred to as a channel interface 335.

The polysilicon gate 315 is composed of relatively large grains (one of which is designated 340). Adjacent grains 340 have boundaries 345 where crystal orientation abruptly changes. These boundaries 345 can connect to form a continuous path (e.g., a grain boundary channel 350) from the top to the bottom of the polysilicon gate 315 down to the gate oxide layer 310. The origin of defects along the channel interface 335 is related in part to the grain structure in the polysilicon gate 315 and the presence of the grain boundary channels 350 which serve as available paths through which dopants, such as relatively mobile boron 355, can travel and diffuse through the polysilicon gate 315 and the gate oxide layer 310 to reach and accumulate at the channel interface 335. The presence of the boron 355 at the channel interface 335 may affect the voltage applied to the gate used to enhance the channel 330. Therefore, the presence of the boron 355 may alter the threshold voltage at that location. In addition, due to the irregular grain boundary shapes, positions and orientations, some portions of the gate oxide layer 310-to-channel interface 335 may not nucleate silicon crystal growth resulting in locally depleted voids 360 wherein no polysilicon is present within the polysilicon gate 315. The presence of these anomalies, being generally dependent on grain boundary shapes, densities and locations, is largely stochastic in nature. Thus measured threshold voltage values generally have a stochastic variation from device to device, thereby resulting in a distribution of threshold voltage differences between nominally identical transistors in a population of matched transistors.

Figure 7A:
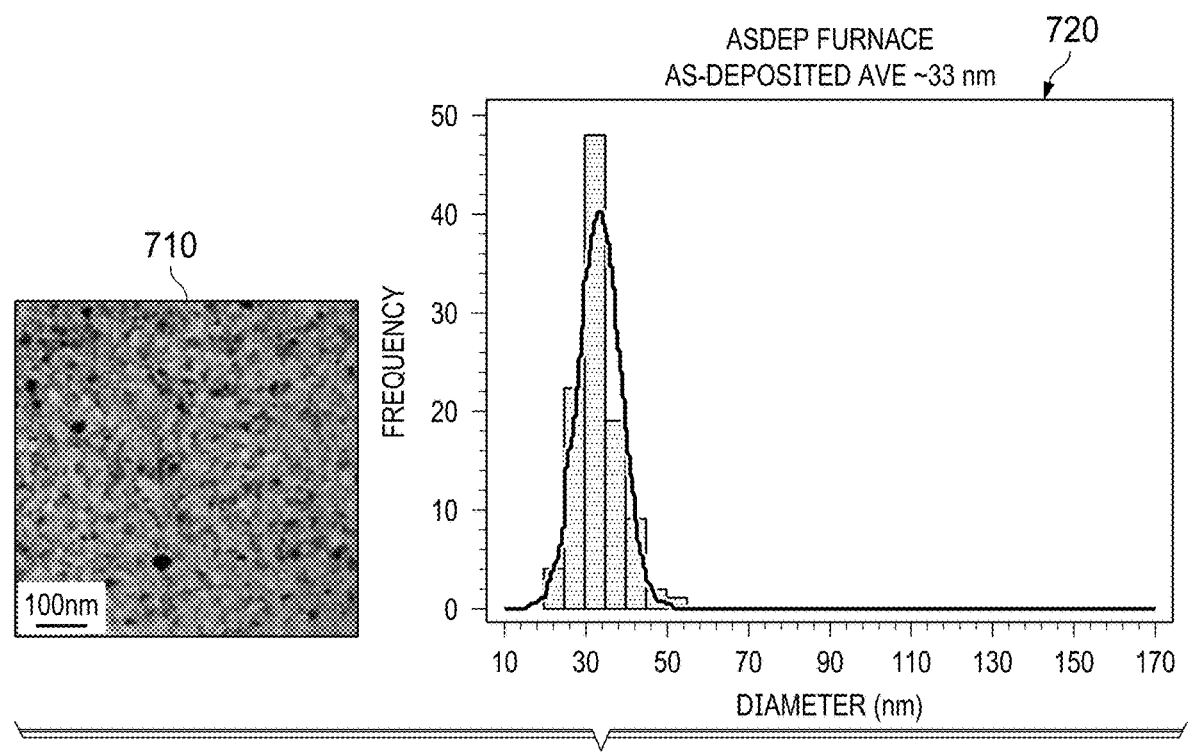
FIGS. 7A and 7B illustrate plan-view transmission electron microscope (TEM) images and grain size distributions of a polysilicon layer using a baseline silane furnace method after deposition (FIG. 7A) and at the end-of-line (FIG. 7B)
Figure 7B:
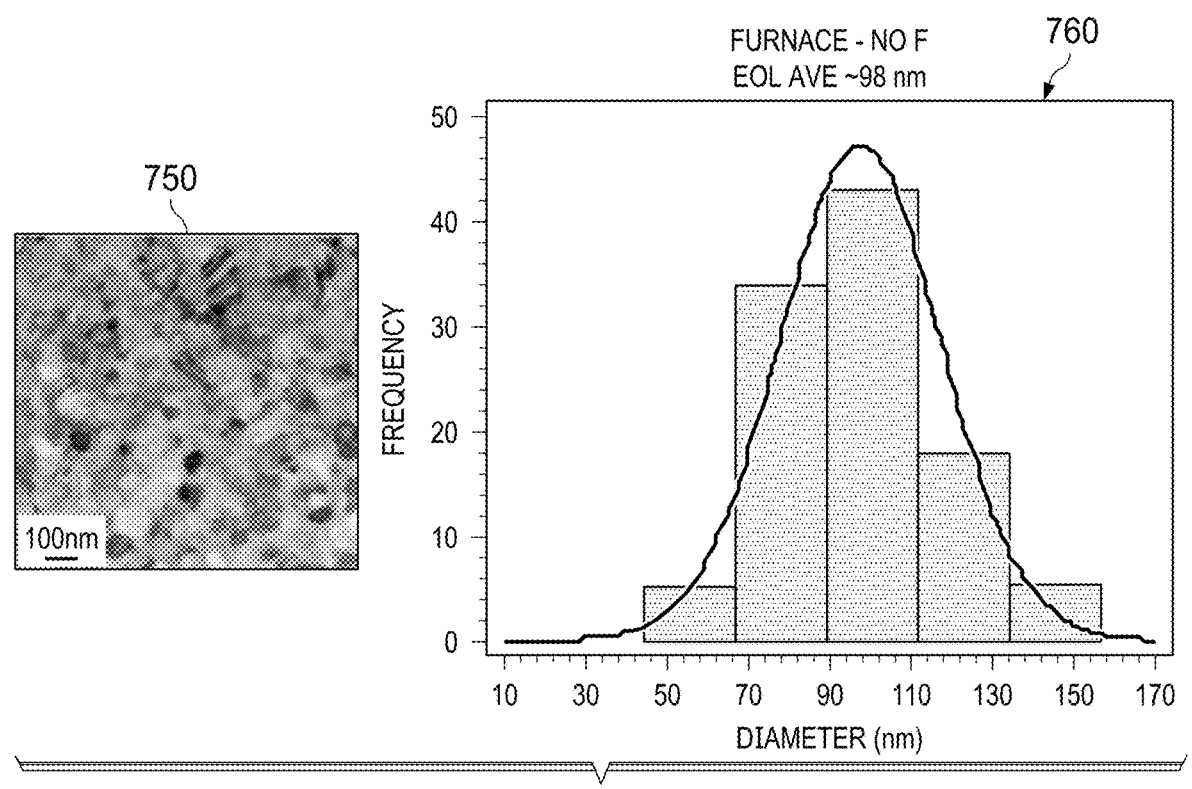

Turning now to FIGS. 7A and 7B, illustrated are electron microscope views and grain size distributions of a polysilicon layer using a baseline silane furnace method after deposition (FIG. 7A) and at the end-of-line (FIG. 7B). FIG. 7A shows a plan view TEM electron micrograph 710 and a corresponding frequency histogram 720 of grain sizes for a polysilicon layer immediately after deposition ("as-deposited"), and FIG. 7B shows a plan view TEM electron micrograph 750 and a frequency histogram 760 of grain sizes for a polysilicon layer at the end-of line of forming the MOSFET including the polysilicon.

The electron microscope is used to observe and measure the grain size. When initially deposited at 620° C. (FIG. 7A), the grain size exhibits a distribution with a minimum grain size of about 22 nm, a maximum grain size of about 54 nm and a mean grain size of about 33 nm. However, after being subjected to the full thermal budget of the fabrication process (FIG. 7B), the grain size exhibits a distribution with a minimum grain size of about 50 nm, a maximum grain size of about 150 nm and a mean grain size of about 98 nm. This increase of mean grain size and widening of the distribution of grain size is understood to result from thermally-activated nucleation and growth that results in fewer, larger grains at the end of the line. For the reasons previously explained, the larger grain size that results after full processing of transistors using the baseline polysilicon formation process is expected to result in greater mobility of dopant atoms through gate electrodes, resulting in a greater σ(ΔVT) of matched transistors on an associated electric device.

However, as described below, the inventors have discovered that an improved formation process desirably produces polysilicon with small grains, but unexpectedly substantially suppresses grain growth that would otherwise result from thermally-activated diffusion from subsequent device processing. Among other aspects of the improved process, silane used in the baseline process is replaced with disilane and hydrogen in the process feedstock. The final morphology of structures formed from the resulting polysilicon layers includes grains that are smaller and more uniform at the end-of-line than are such structures formed from the baseline process. This morphology is found to significantly improve VT uniformity and stability. While the precise mechanism of grain growth suppression is not fully known, the empirical result is profound and to the inventors' knowledge hitherto unobserved.

Figure 4:
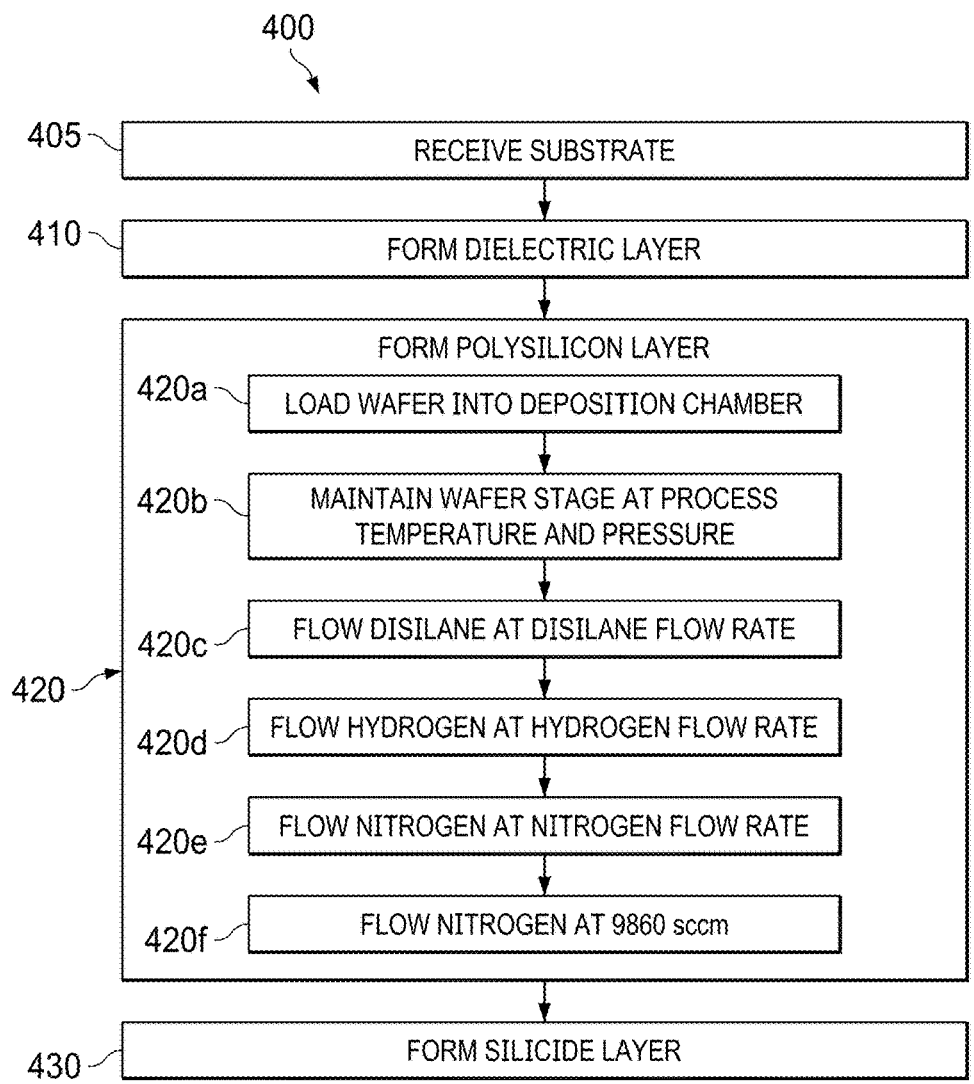
FIG. 4 illustrates a flow diagram of a method of forming an integrated circuit.
Figure 5:
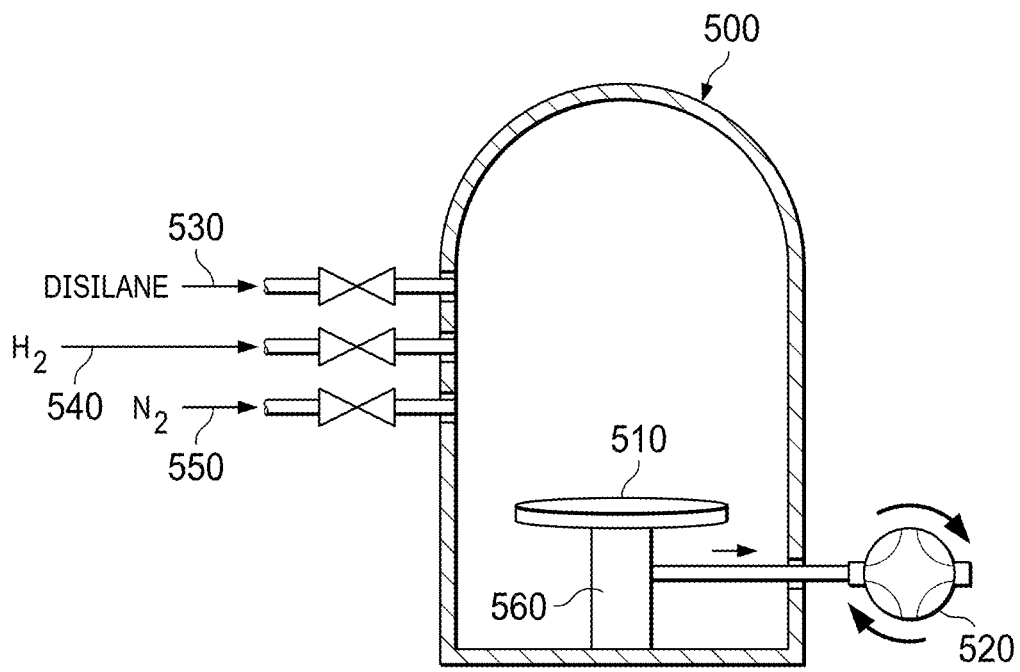
FIG. 5 illustrates a block diagram of a portion of deposition chamber.

FIGS. 4 and 5, illustrate aspects of a method 400 (FIG. 4) and system 500 (FIG. 5) that may be used to form polysilicon films with small grain size and suppressed grain growth, e.g. for use as a transistor gate electrode. These figures are described concurrently in the following discussion. The method 400 begins by obtaining a semiconductor substrate, e.g. a wafer, having partially formed MOS transistors. The partially formed transistors may include various features such as, without limitation, dielectric isolation regions (STI and/or LOCOS), wells, buried layers and/or trench features. A gate dielectric layer such as a silicon oxide is formed over the semiconductor substrate at 410. The gate dielectric layer may be any currently known of future-developed dielectric material, and may be, e.g. a thermally-growth layer of silicon oxide of any desired thickness.

At 420 a polysilicon layer is formed over the semiconductor substrate, e.g. directly on the gate dielectric layer. The forming 420 is detailed in 420a-420b, which are listed serially for the purpose of discussion, though some steps may be performed simultaneously or in a different order than that shown. The wafer 510 substrate is loaded 420a into a deposition chamber 505. The deposition chamber 505 includes, among other things, a low-pressure vacuum pump 520 and gas inlets 530, 540, 550 that connect to a common showerhead or injector (not shown). The wafer 510 is loaded on a wafer chuck 560 that includes a heating element to control its temperature during deposition.

Forming 420 the polysilicon layer includes 420b maintaining the wafer chuck 560 temperature at a process temperature ranging from 700° C. to 725° C., e.g. 710° C., and maintaining the pressure of the deposition chamber 505 at a process pressure ranging from 135 Torr (18 kPa) to 165 Torr (22 kPa), e.g. 150 torr (20 kPa). Forming 420 the polysilicon layer continues by flowing 420c disilane gas ($Si_2H_6$) through the gas inlet 530 at a flow rate of 50 sccm to 100 sccm, e.g. 65 sccm, over the wafer 510. Forming 420 the polysilicon layer also includes flowing 420d hydrogen ($H_2$) through the gas inlet 540 at a flow rate of 2500 sccm to 4000 sccm, e.g. 3300 sccm, over the wafer 510. Forming 420 the polysilicon layer also includes flowing 420e nitrogen ($N_2$) through the gas inlet 550 at a flow rate of 6,000 sccm to 12,000 sccm, e.g. 9,860 sccm over the wafer 510. The process gases may be combined at a manifold and delivered to a showerhead (not shown) spaced apart from the wafer 510 by 12.5 mm to 14.0 mm, e.g. 13.3 mm. Optionally additional nitrogen may be supplied to the process chamber 505 below the wafer 510 to aid exhausting feedstock gases from the chamber 505. Such nitrogen may be supplied via an outlet separate from the showerhead at a flow rate of about 9,000 sccm, for example. Thus the total flow of nitrogen to the process chamber 505 may range from about 16,000 to about 21,100 sccm. Under these conditions the polysilicon layer may be formed at a rate of about 26 Å (2.6 nm) per second. In various examples the method 400 may be used to form the polysilicon layer with a thickness from 80 nm to 150 nm, resulting in a deposition time of about of 38 seconds for a 100 nm film. These process parameters are summarized in the table below for convenience.

| Parameter | min-max (example) |
|---|---|
| Temperature (° C.) | 705-725 (710) |
| Pressure (Torr) | 135-165 (150) |
| Spacing (mm) | 12.5-14.0 (13.3) |
| Disilane (sccm) | 50-100 (65) |
| $H_2$ (sccm) | 2500-4000 (3290) |
| $N_2$ (sccm) | 6000-12000 (9860) |
| Time (s) | 30-60 (38) |

In some examples the method 400 is used to form a polysilicon layer with a thickness of about one half the target final thickness, e.g. about 50 nm. Additional polysilicon may be formed on this initial layer using a batch process such as a tube furnace, using a known (e.g. silane-based) or future-developed process, to form a combined layer with the desired total thickness. Such examples may be beneficial by providing an increase of overall throughput by reducing the time spent by the wafer 510 being processed by the single-wafer method 400. The method 400 concludes by forming 430 a metal silicide layer (not shown) on the polysilicon layer. Multiple process steps not shown may occur between the forming 420 and the forming 430, e.g. gate pattern and etch, gate sidewall formation, and source/drain implant.

Figure 6:
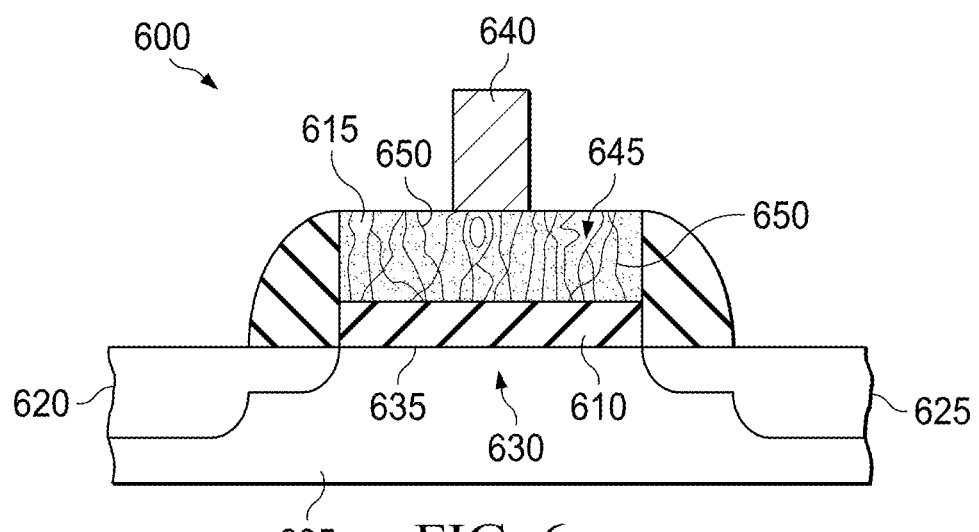
FIG. 6 illustrates a cross sectional view of a portion of a MOSFET.

Turning now to FIG. 6, illustrated is a cross sectional view of a portion of a MOSFET 600. The MOSFET 600 includes a gate dielectric layer, e.g. gate oxide layer 610, formed over a semiconductor substrate 605, and a polysilicon gate electrode, e.g. gate electrode 615, formed over the gate oxide layer 610. The gate electrode 615 is formed in part or entirely using a process consistent with the method 400 as described above. The MOSFET 600 also includes a source 620, a drain 625 and a channel 630 therebetween. The junction between the gate oxide layer 610 and the channel 630 is referred to as a channel interface 635. A metal silicide layer (not shown) is formed on the polysilicon layer 615, which provides an ohmic connection between the polysilicon layer 615 and a gate contact 640 for the MOSFET 600. The metal silicide layer also typically extends over the source 620 and the drain 625 to form ohmic connections to a later-formed source and drain contacts (not shown), respectively, for the MOSFET 600. While not explicitly shown the MOSFET 600 reflects thermal cycles associated with process following formation of the polysilicon layer from which the gate electrode 615 is formed, e.g. a pre-metal dielectric (PMD) layer and various processes to form interconnect and passivation layers over the MOSFET 600.

The gate electrode 615 has a finer grain structure than the baseline gate electrode 315 (FIG. 3). The density of grains, e.g. grains per unit volume, is therefore greater in the gate electrode 615, one grain being designated 645. Similarly the density of the grain boundaries 650 may be significantly greater in the gate electrode 615 than in the gate electrode 315, thereby reducing the chances for grain boundary channels to provide a path for dopants to diffuse through the gate electrode 615 and gate oxide layer 610 and accumulate at the channel interface 635. The fine grain gate electrode 615 therefore is expected and observed reduce threshold voltage variations between nominally matched transistors and other transistors on the IC on which the MOSFET 600 is located.

Figure 8A:
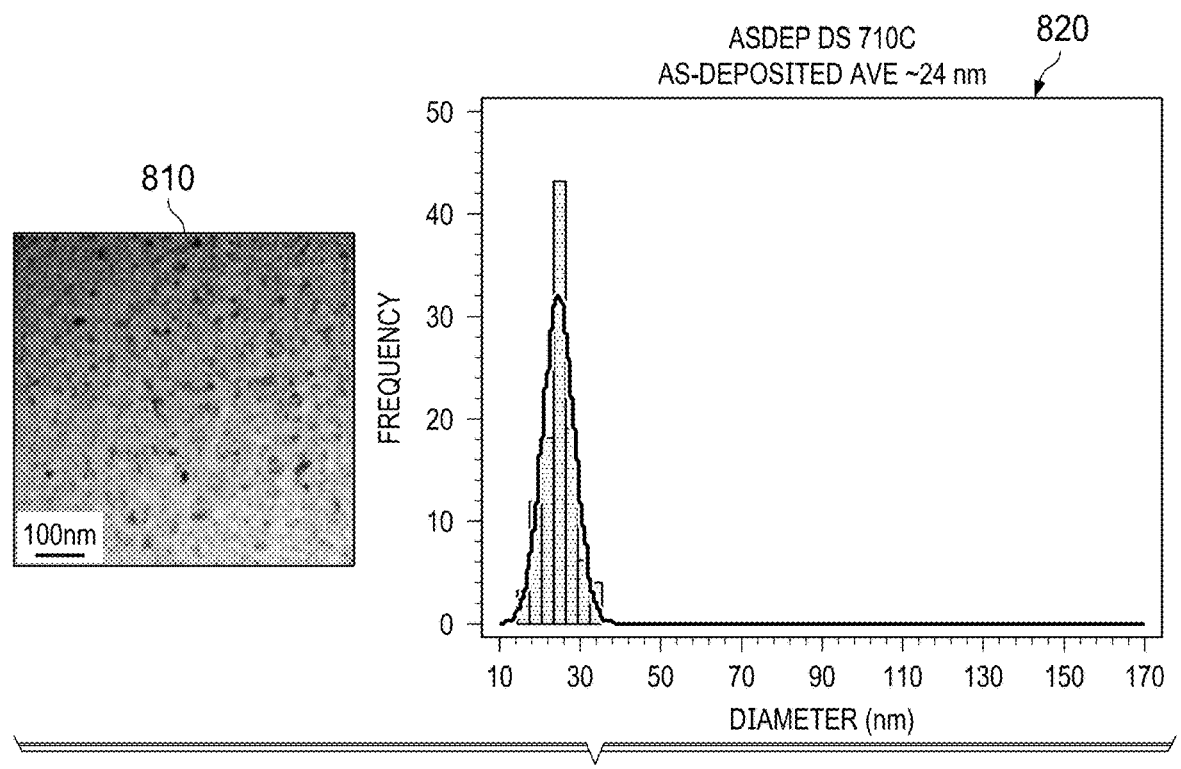
FIGS. 8A and 8B illustrate plan view TEM images and grain size distributions of a polysilicon layer using a disilane method after deposition (FIG. 8A) and at the end-of-line (FIG. 8B)
Figure 8B:
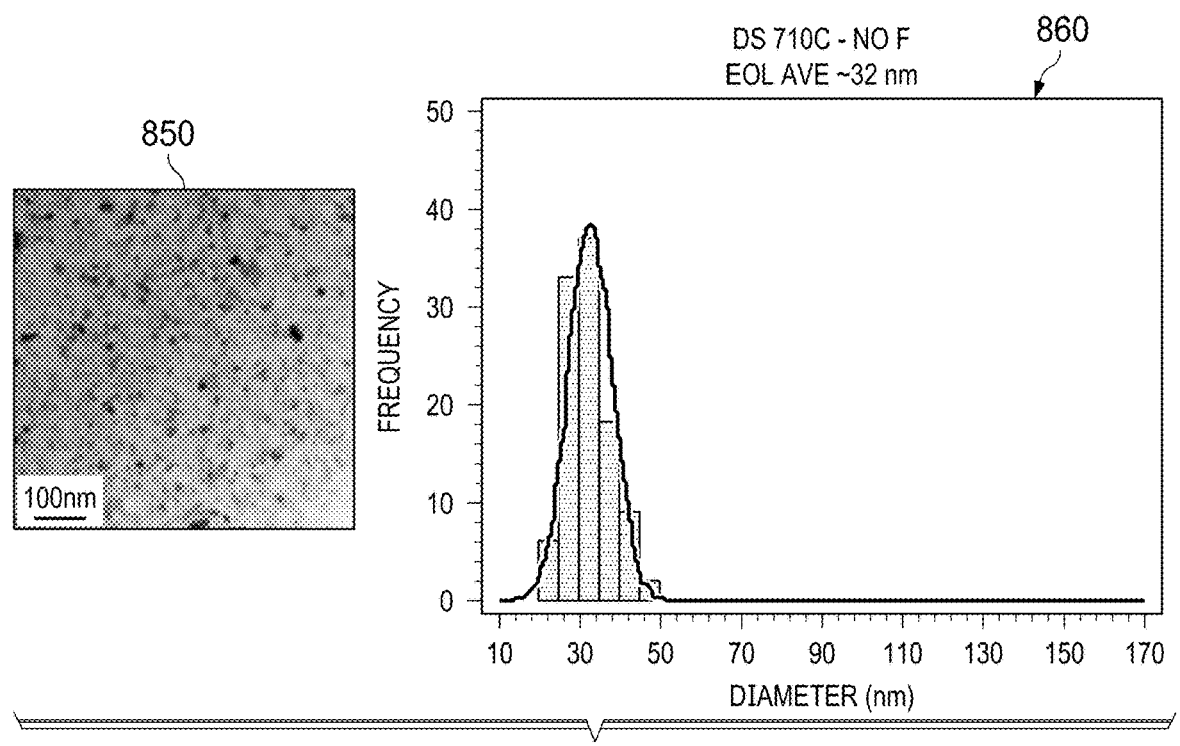

Turning now to FIGS. 8A and 8B, illustrated are electron microscope views and grain size distributions of a polysilicon layer formed according to a method of the disclosure, e.g. the method 400. FIG. 8A shows an electron micrograph 810 and a corresponding frequency histogram 820 of grain sizes for a polysilicon layer immediately after deposition ("as-deposited"), and FIG. 8B shows an electron micrograph 850 and a frequency histogram 860 of grain sizes for a polysilicon layer at the end-of line of forming the MOSFET including the polysilicon layer.

As before the electron microscope is used to observe and measure the grain size. As evidenced by FIG. 8A, the grains of the as-deposited polysilicon film formed at 710° C. have a size that ranges from about 15 nm to about 35 nm with an average size of about 24 nm. At the end-of-line, the grains have a size that ranges from about 20 nm to about 50 nm with an average size of about 32 nm. Thus, compared to FIG. 7B, the end-of-line polysilicon layer formed consistent with the method 400 has grains with an average size and range of sizes about one-third that of the baseline polysilicon layer. Furthermore, treating the histogram 820 as a Gaussian distribution including a range of 6σ, the standard deviation σ of the distribution is about 5 nm.

Figure 9:
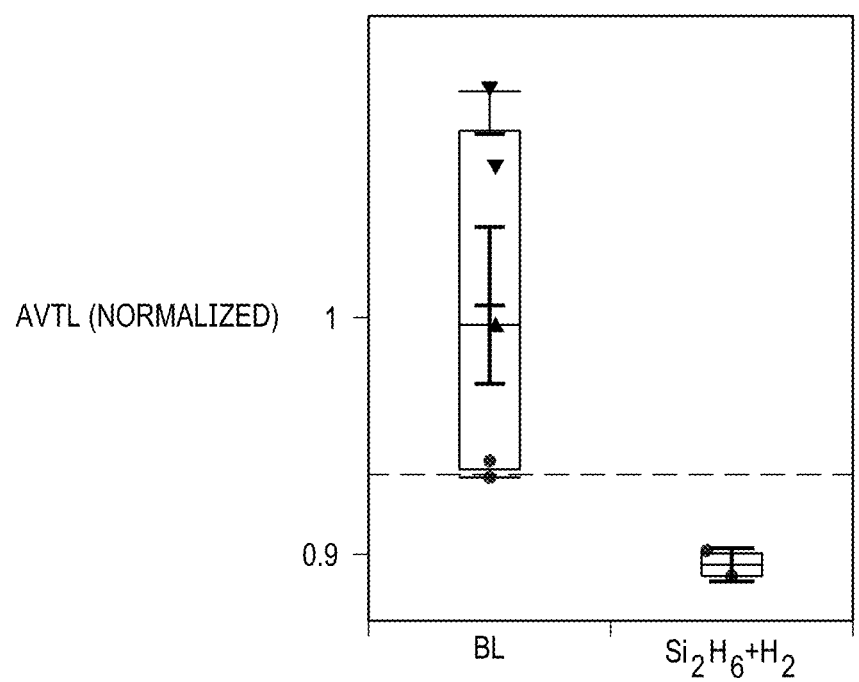
FIG. 9 illustrates a graphical representation comparing the threshold voltage mismatch constant for the baseline silane furnace method versus the disilane method.

Turning now to FIG. 9, illustrated is a graphical representation (box and whisker plots) comparing distributions of the normalized threshold voltage mismatch constant $A_{VT}$ for the baseline (BL) silane furnace method (FIGS. 3, 7A and 7B) versus the disilane ($Si_2H_6+H_2$) method (FIGS. 4-7, 8A and 8B). Reference transistors having polysilicon gate electrodes formed according to the baseline method (silane furnace process) have a normalized mean $A_{VT}$ of unity and a comparatively large scatter. Reference transistors having polysilicon gate electrodes formed according to methods consistent with the disclosure, e.g. the method 400, have an normalized mean $A_{VT}$ about 90% of unity, a reduction that is a significant improvement in this context. Furthermore, in marked contrast the disilane reference transistors have a much lower range of $A_{VT}$ values, e.g. about 6% of the range of the baseline scatter. The distribution of $A_{VT}$ values of the disilane transistors is comfortably below a target value shown by dashed line representing a goal for future scaled transistors.

Polysilicon layers with 100 nm thickness formed by the baseline method were determined to have a sheet resistance σ ranging from about 340Ω/□ to about 400Ω/□, corresponding to a resistivity ranging from about 3.4E-3 Ω-cm to about 4.0E-3 Ω-cm. while similar polysilicon layers formed according to the method 400 (disilane+$H_2$) were determined to have a sheet resistance ranging from about 440Ω/□ to about 490Ω/□, corresponding to a resistivity ranging from about 4.4E-3 Ω-cm to about 4.9E-3 Ω-cm. Higher sheet resistance is attributed to smaller polysilicon film grain size as more grain boundaries impede electron path creating higher electrical resistance. This properly serves as an indirect confirmation of smaller polysilicon grain size resulting from the method 400. Furthermore, films formed according to the disilane/$H_2$ method(s) were found to have a sheet resistance with greater σ (variability) than that of the baseline polysilicon films. This greater variability is attributed to thickness nonuniformity. Such nonuniformity may be reduced using the aforementioned option of forming a first polysilicon sublayer using the disilane+$H_2$ method, and a second polysilicon sublayer using the baseline or similar method (furnace silane).

This significant decrease of $A_{VT}$ and increased $A_{VT}$ uniformity demonstrate an unexpectedly large improvement relative to the baseline process and demonstrate that polysilicon formation methods consistent with the disclosure are a highly promising improvement that enables continued scaling of MOSFET transistors.

Thus, as introduced herein and with continuing reference to representative reference numbers, a method (400) of forming an integrated circuit (200) includes forming (410) a dielectric layer (215a, 215b) over a semiconductor substrate (205), and forming (420) a polysilicon layer (220a, 220b) over the dielectric layer (215a, 215b). The polysilicon layer (220a, 220b) is formed (420, 420c, 420d) by a chemical vapor deposition process that includes providing a gas flow including disilane and hydrogen gas over the semiconductor substrate (205).

The polysilicon layer (220a, 220b) may have a mean grain size of 50 nanometers ("nm") or less (e.g., 32 nm) after forming a metal silicide layer on the polysilicon layer (220a, 220b). The polysilicon layer (220a, 220b) may have a thickness of in range from 100 nm to 150 nm.

The chemical vapor deposition process may be performed at a pressure of about 150 torr and a temperature in a range from 705° C. to 725° C. A representative flow rate for the disilane is 50 to 100 sccm, and for the hydrogen gas is 2,500 to 4,000 sccm. A sheet resistance of the polysilicon layer (220a, 220b) may be in a range between 440Ω/□ and 490 Ω/□.

The chemical vapor deposition process may also include providing the gas flow including the disilane and nitrogen gas over the semiconductor substrate (205). A representative flow rate for the nitrogen gas is 6,000 to 12,000 sccm. In one example, the nitrogen gas is provided at a flow rate of about 9,860 sccm.

The method (400) may also include forming a metal silicide layer on the polysilicon layer (220a, 220b). The dielectric layer (215a, 215b), the polysilicon layer (220a, 220b) and the metal silicide layer form a gate for each of a plurality of metal-oxide semiconductor field-effect transistors (MOSFETs) (210a, 210b).

As introduced herein and with continuing reference to representative reference numbers, an integrated circuit (200) includes a metal-oxide semiconductor field-effect transistor (MOSFET) (210a) having a gate. The gate includes a gate dielectric layer (215a) formed over a semiconductor substrate (205), and a polysilicon layer (220a) formed over the gate dielectric layer (215a) having a mean grain size of 50 nm or less (e.g., 32 nm). The polysilicon layer (220a) may have a standard of deviation of the grain size no greater than plus or minus five nanometers. The polysilicon layer (220a) may have a thickness of in range from 100 nm to 150 nm. A sheet resistance of the polysilicon layer (220a) may be in a range between 440Ω/□ and 490 Ω/□.

The integrated circuit (200) may further include a metal silicide layer formed on the polysilicon layer (220a) and the MOSFET (210a) may be one of a plurality of MOSFETs (210a, 210b) formed over the semiconductor substrate (205). Each MOSFET (210a) of the plurality of MOSFETs (210a, 210b) may be rated to operate at a gate voltage of about 5 volts (V).

As introduced herein and with continuing reference to representative reference numbers, an integrated circuit (200) includes a plurality of metal-oxide semiconductor field-effect transistors (MOSFETs) (210a, 210b). Each MOSFET (210a, 210b) has a gate area in a range of gate areas.

Each MOSFET (210a, 210b) may have a polysilicon layer (220a, 220b) formed over a gate dielectric layer (215a, 215b) having a mean grain size of 50 nanometers (nm) or less (e.g., 32 nm). The polysilicon layer (220a, 220b) formed over a gate dielectric layer (215a, 215b) may have a thickness of 100 nm to 150 nm. The polysilicon layer (220a, 220b) formed over a gate dielectric layer (215a, 215b) may have a sheet resistance in a range between 440Ω/□ and 490Ω/□. Each MOSFET (210a, 210b) may be rated to operate at a gate voltage of about 5 volts (V).

Thus, a semiconductor device with a fine grain polysilicon layer, and related method of forming the same, has been introduced. It should be understood that the previously described examples of the semiconductor device, and related methods, are submitted for illustrative purposes only and that other examples capable of controlling threshold voltage are well within the broad scope of the present disclosure.

Although the present disclosure has been described in detail, various changes, substitutions and alterations may be made without departing from the spirit and scope of the disclosure in its broadest form.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed:

1. A method of forming an integrated circuit, comprising:
forming a dielectric layer over a semiconductor substrate including a MOS transistor area; and
forming a polysilicon layer over the dielectric layer, the forming including a chemical vapor deposition process that includes providing a gas flow including disilane and hydrogen gas over the semiconductor substrate at a pressure in a range from 135 torr to 165 torr.

2. The method as recited in claim 1, wherein forming the polysilicon layer includes the chemical vapor deposition process that includes providing the gas flow including the disilane and nitrogen gas over the semiconductor substrate.

3. The method as recited in claim 2, wherein the gas flow includes the nitrogen gas at a flow rate of 6,000 to 12,000 standard cubic centimeters per minute (sccm).

4. The method as recited in claim 2, wherein the gas flow includes the nitrogen gas provided at a flow rate of about 9,860 standard cubic centimeters per minute (sccm).

5. The method as recited in claim 1, wherein the polysilicon layer has a mean grain size of 50 nanometers (nm) or less after forming a metal silicide layer on the polysilicon layer.

6. The method as recited in claim 1, wherein the polysilicon layer has a mean grain size of about 32 nanometers (nm) after forming a metal silicide layer on the polysilicon layer.

7. The method as recited in claim 1, wherein the polysilicon layer has a thickness of in range from 100 nanometers to 150 nanometers.

8. The method as recited in claim 1, wherein the chemical vapor deposition process is performed at a pressure of about 150 torr.

9. The method as recited in claim 1, wherein the chemical vapor deposition process is performed at a temperature in a range from 705° C. to 725° C.

10. The method as recited in claim 1, wherein the disilane is provided at a flow rate in a range from 50 standard cubic centimeters per minute (sccm) to 100 sccm.

11. The method as recited in claim 1, wherein the hydrogen gas is provided at a flow rate in a range from 2,500 standard cubic centimeters per minute (sccm) to 4,000 sccm.

12. The method as recited in claim 1, further comprising forming a metal silicide layer on the polysilicon layer, wherein the dielectric layer, the polysilicon layer and the metal silicide layer form a gate for each of a plurality of metal-oxide semiconductor field-effect transistors (MOSFETs).

13. The method as recited in claim 1, wherein a sheet resistance of the polysilicon layer is in a range between 440 $\Omega/\square$ and 490 $\Omega/\square$.

14. A method of forming an integrated circuit, comprising:
forming a source region and a drain region extending into a semiconductor substrate having a top surface;
forming a dielectric layer over the top surface; and
forming a gate electrode over the dielectric layer and between the source region and the drain region, the gate electrode comprising polysilicon,
wherein forming the gate electrode includes a chemical vapor deposition (CVD) process that includes providing a gas flow including disilane gas and hydrogen gas over the semiconductor substrate at a pressure in a range from 135 torr to 165 torr.

15. The method as recited in claim 14, wherein the gas flow includes disilane gas at a flow rate in a range from 50 standard cubic centimeters per minute (sccm) to 100 sccm.

16. The method as recited in claim 15, wherein the disilane gas flow rate is about 65 sccm.

17. The method as recited in claim 14, wherein the gas flow includes hydrogen gas at a flow rate in a range from 2,500 standard cubic centimeters per minute (sccm) to 4,000 sccm.

18. The method as recited in claim 17, wherein the hydrogen gas flow rate is about 3290 sccm.

19. The method as recited in claim 14, wherein the gas flow includes nitrogen at a flow rate of 6,000 to 12,000 standard cubic centimeters per minute (sccm).

20. The method as recited in claim 19, wherein the nitrogen gas flow rate is about 9,860 sccm.

21. The method as recited in claim 14, wherein the CVD process is performed at a pressure of about 150 torr.

22. The method as recited in claim 14, wherein the CVD process is performed at a temperature in a range from 705° C. to 725° C.

23. The method as recited in claim 1, wherein the gas flow does not include a dopant gas.

24. The method as recited in claim 14, wherein the gate electrode is undoped as formed.

25. A method of forming an integrated circuit, comprising:
forming doped regions having a first conductivity type spaced apart in a semiconductor substrate having an opposite second conductivity type;
forming a dielectric layer directly on a top surface of the semiconductor substrate; and
forming a polysilicon electrode directly on the dielectric layer and between the doped regions in a deposition chamber,
wherein forming the polysilicon electrode includes a chemical vapor deposition (CVD) process that provides a gas flow including disilane gas at a flow rate in a range from 50 sccm to 100 sccm and hydrogen at a flow rate in a range from 2500 sccm to 4000 sccm while maintaining a temperature of the semiconductor substrate in a range from 705° C. to 725° C. and a pressure within the deposition chamber in a range from 135 torr to 165 torr.

26. The method as recited in claim 25, wherein the disilane flow rate is about 65 sccm, the hydrogen flow rate is about 3290 sccm, the temperature is about 710° C. and the pressure is about 150 torr.

* * * * *